United States Patent
Lin et al.

(10) Patent No.: US 9,466,687 B2
(45) Date of Patent: Oct. 11, 2016

(54) METHODS FOR PRODUCING BIPOLAR TRANSISTORS WITH IMPROVED STABILITY

(71) Applicants: Xin Lin, Phoenix, AZ (US); Daniel J. Blomberg, Chandler, AZ (US); Hongning Yang, Chandler, AZ (US); Jiang-Kai Zuo, Chandler, AZ (US)

(72) Inventors: Xin Lin, Phoenix, AZ (US); Daniel J. Blomberg, Chandler, AZ (US); Hongning Yang, Chandler, AZ (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 205 days.

(21) Appl. No.: 14/157,317

(22) Filed: Jan. 16, 2014

(65) Prior Publication Data
US 2014/0134820 A1 May 15, 2014

Related U.S. Application Data

(62) Division of application No. 12/908,586, filed on Oct. 20, 2010, now Pat. No. 8,648,443.

(51) Int. Cl.
H01L 21/331 (2006.01)
H01L 29/66 (2006.01)
H01L 21/8228 (2006.01)
H01L 27/082 (2006.01)
H01L 29/735 (2006.01)

(52) U.S. Cl.
CPC ..... *H01L 29/6625* (2013.01); *H01L 21/82285* (2013.01); *H01L 27/0826* (2013.01); *H01L 29/735* (2013.01)

(58) Field of Classification Search
CPC .............. H01L 21/82285; H01L 29/6625; H01L 29/735; H01L 27/0826
USPC ........... 438/350; 257/565, E21.608, E29.174
See application file for complete search history.

(56) References Cited

U.S. PATENT DOCUMENTS

| | | | |
|---|---|---|---|
| 4,178,190 A | * | 12/1979 | Polinsky ............ H01L 21/2253 257/565 |
| 5,342,794 A | | 8/1994 | Wei |
| 5,659,197 A | | 8/1997 | Wei |
| 5,726,069 A | | 3/1998 | Chen et al. |
| 6,803,634 B2 | | 10/2004 | Okuno et al. |

(Continued)

OTHER PUBLICATIONS

Honda, H. et. al., "Suppression of hot carrier effects by laterally graded emitter (LGE) structure in BiCMOS", IEDM Tech. Dig., pp. 227-230, 1990.

(Continued)

*Primary Examiner* — Vongsavanh Sengdara

(57) ABSTRACT

Instability and drift sometimes observed in bipolar transistors, having a portion of the base extending to the transistor surface between the emitter and base contact, can be reduced or eliminated by providing a further doped region of the same conductivity type as the emitter at the transistor surface between the emitter and the base contact. The further region is desirably more heavily doped than the base region at the surface and less heavily doped than the adjacent emitter. In another embodiment, a still or yet further region of the same conductivity type as the emitter is provided either between the further region and the emitter or laterally within the emitter. The still or yet further region is desirably more heavily doped than the further region. Such further regions shield the near surface base region from trapped charge that may be present in dielectric layers or interfaces overlying the transistor surface.

20 Claims, 7 Drawing Sheets

(56) References Cited

U.S. PATENT DOCUMENTS

| | | |
|---|---|---|
| 2003/0085414 A1 | 5/2003 | Okuno et al. |
| 2005/0023644 A1 | 2/2005 | Okuno et al. |
| 2008/0054407 A1* | 3/2008 | Ko .................. H01L 29/1008 257/565 |
| 2008/0290463 A1* | 11/2008 | Stecher ............ H01L 29/0808 257/565 |

OTHER PUBLICATIONS

Huang, T. et. al., "Suppression of both sidewall injection and hot-carrier effects using laterally graded emitter in bipolar transistor", Proc. VLSITSA 1991, pp. 205-209.

Burnett, J.D. et. al., "Bipolar reliability optimization through surface compensation of the base profile", Proc. IRPS 1992, pp. 107-111.

* cited by examiner

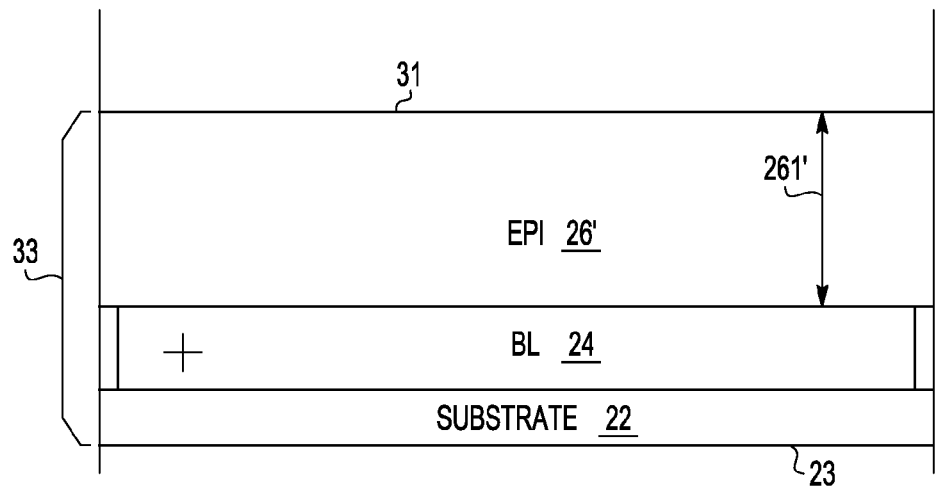
404  504    FIG. 5
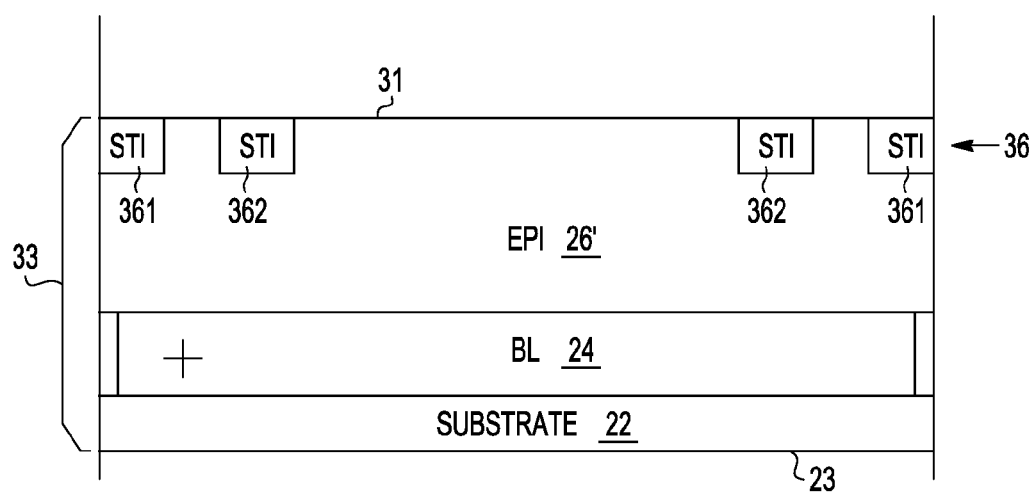
405  505    FIG. 6

METHODS FOR PRODUCING BIPOLAR TRANSISTORS WITH IMPROVED STABILITY

CROSS-REFERENCES TO RELATED APPLICATIONS

This is a divisional of co-pending U.S. application Ser. No. 12/908,586, filed Oct. 20, 2010.

FIELD OF THE INVENTION

The present invention generally relates to semiconductor devices and circuits and methods for fabricating semiconductor devices and circuits, and more particularly relates to semiconductor devices and circuits embodying contiguous NPN or PNP regions, as for example, bipolar transistors.

BACKGROUND OF THE INVENTION

Contiguous NPN or PNP regions and bipolar transistors are much used in modern electronics as individual devices and as part of various integrated circuits (ICs). The stability of such devices as a function of time and/or usage is an important property. It has been found under some circumstances, that the base current, the collector current, the current gain and/or other properties of such devices may drift as a function of time and/or usage. This is undesirable. Accordingly, a need continues to exist for improved bipolar transistors and other contiguous NPN or PNP regions, and methods for manufacturing the same, in which such drift in properties is reduced or eliminated.

BRIEF DESCRIPTION OF THE DRAWINGS

The present invention will hereinafter be described in conjunction with the following drawing figures, wherein like numerals denote like elements, and wherein:

FIGS. 5-12 show simplified cross-sectional views of the bipolar transistors of FIGS. 1-3 during various stages of manufacture.

DETAILED DESCRIPTION OF THE INVENTION

Figure 1:
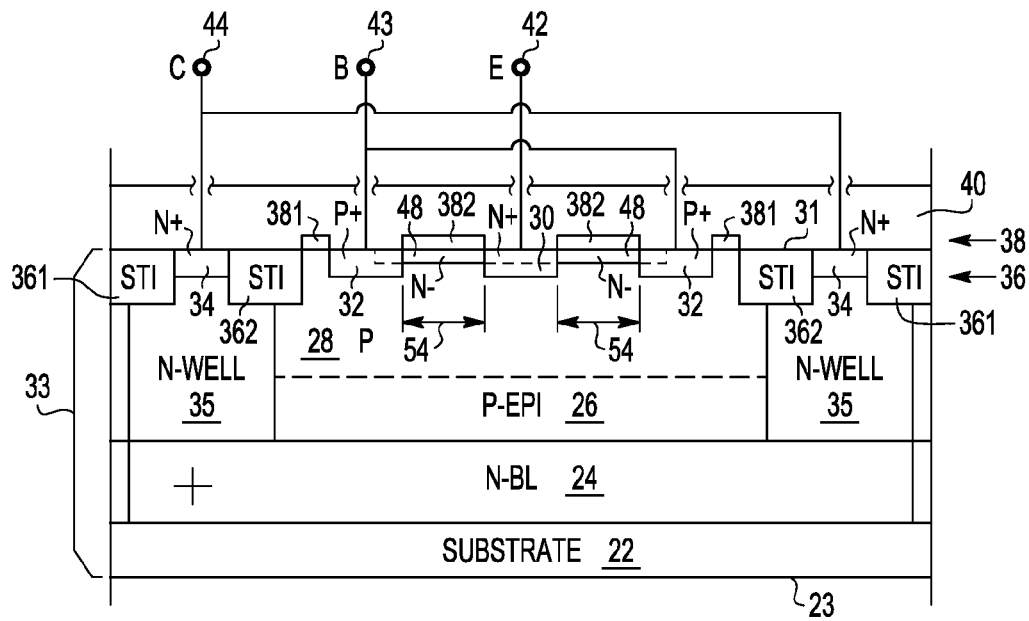
FIG. 1 shows a simplified cross-sectional view of an improved bipolar transistor according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "SC substrate" are intended to include single crystal structures, polycrystalline structures, amorphous structures, thin film structures, layered structures as for example and not intended to be limiting, semiconductor-on-insulator (SOI) structures, and combinations thereof.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type is then either P or N type. As used herein, the term "bipolar transistor", singular or plural, is intended to include any type of semiconductor device employing contiguous NPN or PNP regions some of which exhibit minority carrier conduction, even though further doped regions may be included in such devices. Various embodiments of the invention will be illustrated for NPN bipolar transistors, but this is merely for convenience of description and is not intended to be limiting. Persons of skill in the art will understand that PNP transistors and other semiconductor devices and circuits embodying either or both NPN and PNP combinations may be provided by appropriate interchange of conductivity types in the various regions.

It has been discovered that bipolar transistor instabilities or properties drift can arise from surface effects in the base between the emitter and the base contact region. Such surface effects may arise from charge trapped in overlying dielectric layers or at interfaces between overlying dielectric and conductor layers or from other causes. Charge trapped in such overlying layers can affect the carrier concentration in base region(s) at or near the SC surface, thereby altering the properties of the base and its effect on the collector current. This trapped charge and therefore the near-surface carrier concentration can change with time and/or usage. This is believed to give rise to the observed drift in transistor properties. It has been discovered that the susceptibility of such transistors or other devices to these effects can be reduced or eliminated by modifying the doping of the near-surface regions of the base between the base contact region(s) and the emitter, as illustrated in connection with FIGS. 1-3 and elsewhere herein.

FIG. 1 shows simplified cross-sectional view 20 of improved bipolar transistor 21 according to an embodiment of the present invention. Transistor 21 comprises substrate 22 (e.g., P type SC) having lower surface 23 and in or on which have been formed (e.g., N type) buried layer (BL) 24, base regions 26, 28 (e.g., P type), and (e.g., N+) emitter 30 proximate upper surface 31. For convenience of description and not intended to be limiting, the region between rear or lower surface 23 and front or upper surface 31 is referred to as semiconductor (SC) 33, even though in some embodiments it may comprise non-SC elements, as for example and not intended to be limiting in the case of a semiconductor-on-insulator (SOI) structure. Base contacts (e.g., P+) 32 extend from surface 31 into portion 28 of (e.g., P type) base 26, 28 and are laterally separated from emitter 30 by distance 54. Collector contacts (e.g., N+) 34 proximate surface 31 are in ohmic contact with deep (e.g., N type) wells 35 that extend to buried layer (BL) 24, thereby providing front surface access to BL 24 that acts as the primary collector of transistor 21. For convenience of description and not intended to be limiting, such wells may be identified by the abbreviation "NW" or "NWs" or WELLs even though it will be understood that in various embodiments they may have either N or P conductivity type. In still other embodiments, deep WELLs 35 may be omitted and collector contact made via substrate 22 of appropriate conductivity and rear surface 23. Either arrangement is useful.

Figure 2:
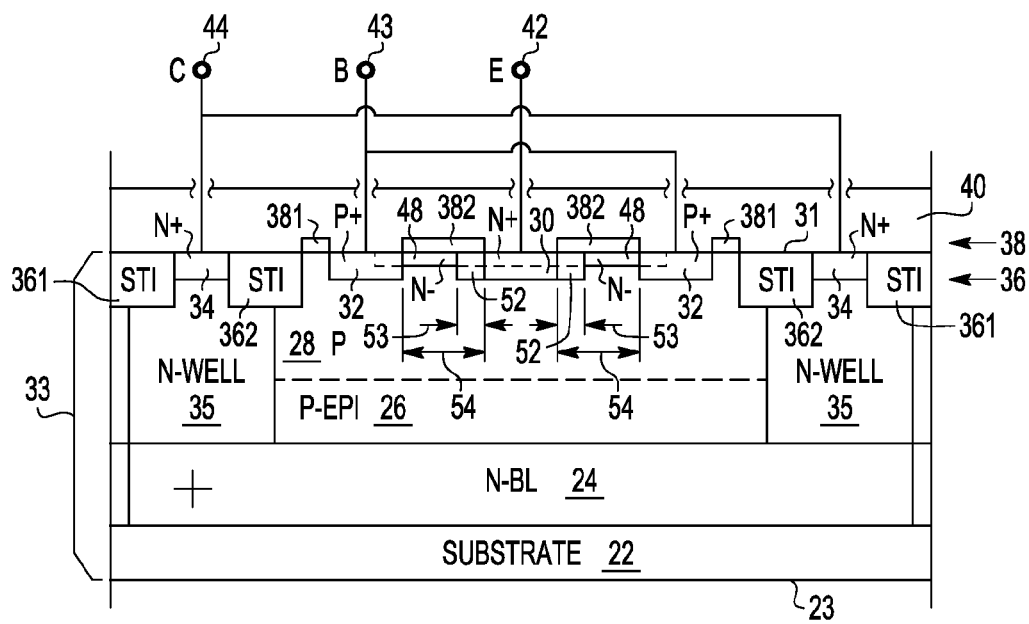
FIG. 2 shows a simplified cross-sectional view of an improved bipolar transistor according to another embodiment of the present invention.
Figure 3:
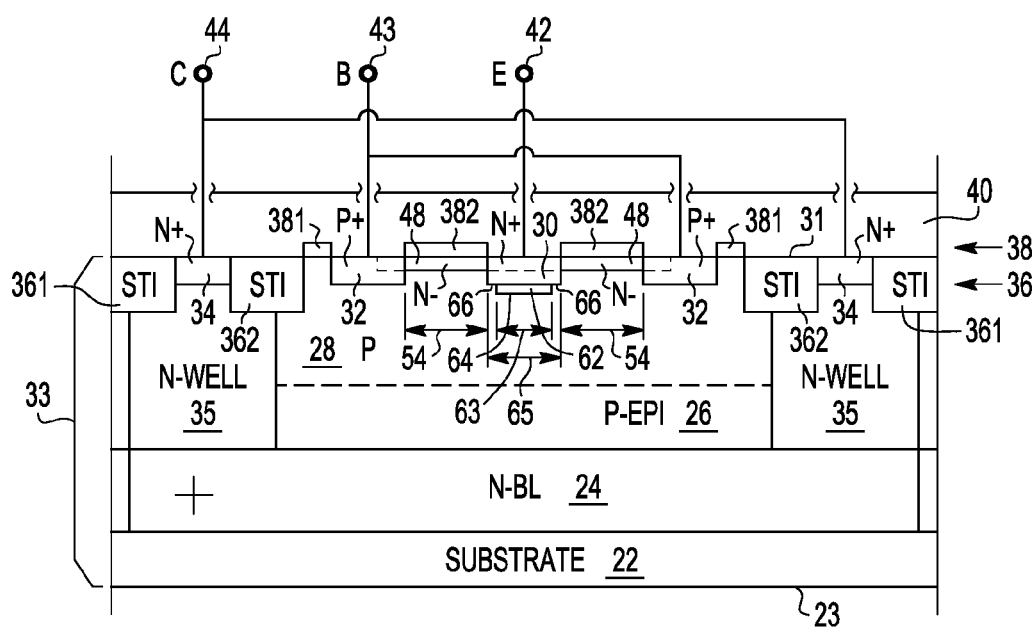
FIG. 3 shows a simplified cross-sectional view of an improved bipolar transistor according to still another embodiment of the present invention.

Extending from surface 31 into SC 33 are shallow trench isolation (STI) regions 36 having portions 361, 362 separating WELLs 35 from, for example, base portion 28 at surface 31 and WELLs 35 from other portions of SC 33 lying laterally outboard of transistor 21. While two base contacts 32, two collector contacts 34, two STI regions 361 and two STI regions 362 are shown in FIGS. 1-3 and elsewhere, it will be understood by those of skill in the art that such regions may be coupled, e.g., in the case of regions 32, 34 by conductive leads overlying surface 31, or may be parts of common (e.g., annular) regions 32, 34, 361, 362 that lie in front of and/or behind the plane of FIGS. 1-3.

Overlying surface 31 is blocking layer 38 of, for example, an oxide and nitride stack, having portion 381 lying between STI regions 362 and base contact(s) 32, and portion 382 lying between base contact(s) 32 and emitter 30. Blocking layer 38 is preferred but may be omitted in further embodiments. Overlying surface 31 and blocking layer 38 is dielectric layer 40 in which openings (indicated schematically) are provided extending to emitter 30, base contact(s) 32 and collector contact(s) 34, so that emitter terminal 42, base terminal 43 and collector terminal 44 may be provided in a conventional manner.

By way of example and not intended to be limiting: (a) substrate 22 when of SC material has doping usefully in the range of about 1E14 to 1E17 atoms per $cm^3$, more conveniently in the range of about 5E14 to 1E16 atoms per $cm^3$, and preferably about 1-5E15 atoms per $cm^3$; (b) BL 24 has doping usefully in the range of about 1E16 to 5E19 atoms per $cm^3$, more conveniently in the range of about 1E17 to 1E19 atoms per $cm^3$, and preferably about 5E17 to 5E18 atoms per $cm^3$; (c) base region 26 has doping usefully in the range of about 1E14 to 1E18 atoms per $cm^3$, more conveniently in the range of about 5E14 to 5E16 atoms per $cm^3$, and preferably about 1-5E15 atoms per $cm^3$; (d) base region 28 has doping usefully in the range of about 1E14 to 1E19 atoms per $cm^3$, more conveniently in the range of about 1E16 to 1E18 atoms per $cm^3$, and preferably about 1-5E17 atoms per $cm^3$; (e) emitter 30 has doping usefully in the range of about 1E19 to 1E23 atoms per $cm^3$, more conveniently in the range of about 1E20 to 1E22 atoms per $cm^3$, and preferably about 5E20 to 5E21 atoms per $cm^3$; (f) base contacts 32 have doping usefully in the range of about 1E19 to 1E23 atoms per $cm^3$, more conveniently in the range of about 1E20 to 1E22 atoms per $cm^3$, and preferably about 5E20 to 5E21 atoms per $cm^3$; (g) collector contacts 34 have doping usefully in the range of about 1E19 to 1E23 atoms per $cm^3$, more conveniently in the range of about 1E20 to 1E22 atoms per $cm^3$, and preferably about 5E20 to 5E21 atoms per $cm^3$; and (h) collector wells 35 have doping usefully in the range of about 1E16 to 5E19 atoms per $cm^3$, more conveniently in the range of about 1E17 to 1E19 atoms per $cm^3$, and preferably about 5E17 to 5E18 atoms per $cm^3$. Higher and lower values may also be used for these various regions. Stated another way, base region 28 has a doping density about $10^{-3}$ times that of emitter 30 and about $10^2$ times that of base region 26, but larger and smaller ratios may also be used.

It has been found that the instability and/or drift previously described can be minimized by providing relatively shallow (e.g., N type) region(s) 48 in (e.g., P type) base region 28, extending between base contact(s) 32 and emitter 30 proximate surface 31. Region(s) 48 should be of opposite conductivity type than base region 28 and the same conductivity type as emitter 30. Where emitter 30 has a peak doping density such as described above, located about 0.1 to 0.3 micrometers beneath surface 31, then region(s) 48 has a peak doping density usefully in the range of about 1E16 to 5E19 atoms per $cm^3$, more conveniently in the range of about 1E17 to 1E19 atoms per $cm^3$, and preferably about 0.5-2.0E18 atoms per $cm^3$ near surface 31, dropping off by a factor of about $10^2$ by about 0.1 to 0.2 micrometers beneath surface 31. Stated another way, it is desirable that region 48 be of opposite conductivity type to base region 28 and with a surface concentration about an order of magnitude larger than the doping density of base region 28. It is further useful that the doping profile of region 48 fall to about equal or less than that of base region 28 within a depth beneath surface 31 equal or less than the emitter depth, desirably within about 5 to 60 percent of the emitter depth and preferably within about 25 percent of the emitter depth, but larger or smaller depths may also be used in other embodiments.

FIG. 2 shows simplified cross-sectional view 50 of improved bipolar transistor 51 according to another embodiment of the present invention. Transistor 51 of FIG. 2 is similar in many respects to transistor 21 of FIG. 1. Accordingly, the same reference numbers are used to identify similar regions and the discussion of such regions (e.g., location, doping, depth, etc.) given in connection with transistor 21 of FIG. 1 also applies to the analogous regions in transistor 51 of FIG. 2. Transistor 51 of FIG. 2 differs from transistor 21 of FIG. 1 by the addition of (e.g., N type) region(s) 52 at the lateral periphery of (e.g., N+) emitter 30 between emitter 30 and (e.g., N type) regions 48 at surface 31. Region(s) 52 have peak doping usefully in the range of about 1E16 to 1E20 atoms per cm$^3$, more conveniently in the range of about 1E17 to 5E19 atoms per cm$^3$, and preferably about 1E18 to 1E19 atoms per cm$^3$ and depth somewhat similar to that of emitter 30, but higher or lower doping and different depths may also be used in additional embodiments. Stated another way, it is useful that regions 52 have a doping density that is in the range of about 1 to 100, more conveniently about 1.5 to 20 and preferably about 2 to 10 times that of further regions 48. Lateral width 53 of regions 52 is usefully about 0 to 90 percent, more conveniently about 10 to 70 percent and preferably about 50 percent of spacing 54 between base contact 32 and emitter 30.

FIG. 3 shows simplified cross-sectional view 60 of improved bipolar transistor 61 according to yet another embodiment of the present invention. Transistor 61 of FIG. 3 is similar in many respects to transistor 21 of FIG. 1. Accordingly, the same reference numbers are used to identify similar regions and the discussion of such regions (e.g., location, doping, depth, etc.) given in connection with transistor 21 of FIG. 1 also applies generally to the analogous regions in transistor 61 of FIG. 3. Transistor 61 of FIG. 3 differs from transistor 21 of FIG. 1 by the addition of (e.g., N type) region 62 of width 63, preferably within the lateral periphery of (e.g., N+) emitter 30 of width 65, proximate surface 31. Region 62 has peak doping usefully in the range of about 1E16 to 1E20 atoms per cm$^3$, more conveniently in the range of about 1E17 to 5E19 atoms per cm$^3$, and preferably about 1E18 to 1E19 atoms per cm$^3$, but higher or lower doping and different depths may also be used in additional embodiments. The combination of doped region 62 and emitter 30 results in the portion of the base underlying region 62 being slightly counter-doped so that emitter-base junction 64 beneath region 62 is slightly deeper than emitter-base junction 66 lying laterally outside of region 62. It has been found that this usefully improves the beta of transistor 61. Lateral width 63 of region 62 is usefully about 10 to 100 percent, more conveniently about 15 to 100 percent and preferably about 90 percent of lateral width 65 of emitter 30.

In plan view, transistors 21, 51, 61 may have in some embodiments, an annular plan view shape so that regions 36, 35, 32, 30, 48, 52, 361, 36, 381, 382, etc., shown in FIGS. 1-3 are substantially closed in plan view. In other embodiments, regions 36, 35, 32, 30, 48, 52, 361, 36, 381, 382, etc., may have rectilinear or other non-annular plan view shapes terminating, for example, in planes above and below the plane of FIGS. 1-3 by dielectric isolation walls. Either arrangement is useful.

Figure 4:
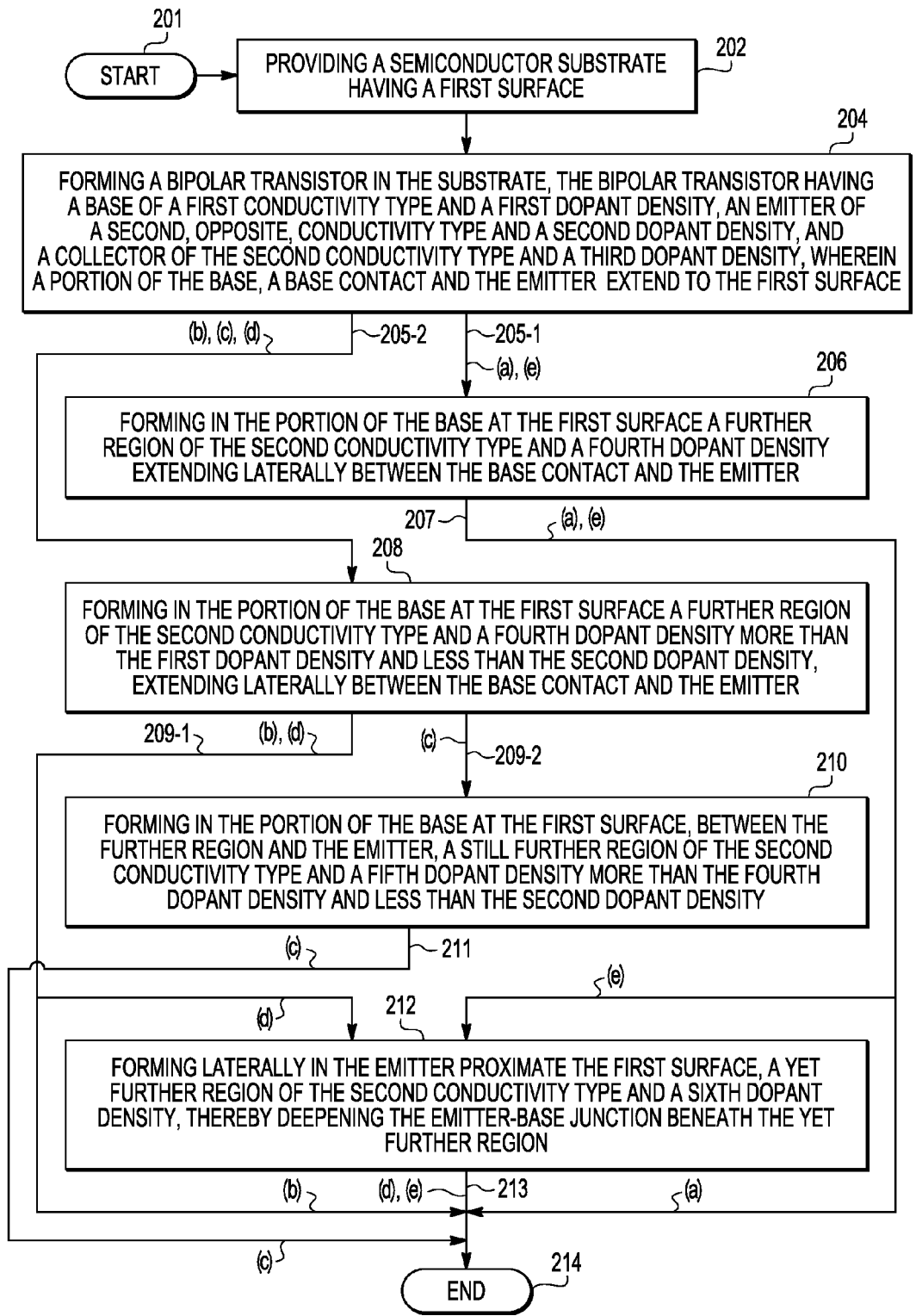
FIG. 4 is a simplified flow chart of a method of manufacture according to a further embodiment of the present invention.

FIG. 4 shows simplified flow chart 200 of a method of manufacture of the transistors of FIGS. 1-3, according to further embodiments of the present invention. Method 200 begins with START 201 and initial step 202 wherein a semiconductor containing substrate (e.g., SC 33) is provided having a first surface (e.g., surface 31). In step 204, a bipolar transistor (e.g., transistor 21, 51, 61) is formed in the substrate (e.g., SC 33) having: (i) a base (e.g., base 26 and/or 28) of a first conductivity type and first dopant density; (ii) an emitter (e.g., emitter 30) of a second, opposite, conductivity type and second dopant density; (iii) a collector (e.g., collector 24, 35) of the second conductivity type and third dopant density; and (iv) wherein a portion (e.g., portion 28) of the base (e.g., base 26, 28), a base contact (e.g., base contact 32) and the emitter (e.g., emitter 30) extend to the first surface (e.g., surface 31). Method 200 has several alternate embodiments illustrated, for example, by implementations (a), (b), (c), (d) or (e). Implementation (a) comprises steps 202 and 204, path 205-1 to step 206 and path 207 to END 214. In step 206, there is formed in the portion of the base at the first surface (e.g., portion 28) a further region (e.g., region 48) of the second conductivity type and a fourth dopant density, extending laterally between the base contact (e.g., contact 32) and the emitter (e.g., emitter 30). Implementation (b) comprises steps 202 and 204, path 205-2 to step 208 and path 209-1 to END 214. In step 208, there is formed in the portion of the base (e.g., portion 28) at the first surface (e.g., surface 31) a further region (e.g., region 48) of the second conductivity type and a fourth dopant density more than the first dopant density and less than the second dopant density, extending laterally between the base contact (e.g., contact 32) and the emitter (e.g., emitter 30). Implementation (c) comprises steps 202 and 204, path 205-2 to step 208, path 209-2 to step 210 and path 211 to END 214. In step 210 there is formed in the portion of the base (e.g., portion 28) at the first surface (e.g., surface 31) between the further region (e.g., region 48) and the emitter (e.g., emitter 30) a still further region (e.g., region 52) of the second conductivity type and a fifth dopant density more than the fourth dopant density and less than the second dopant density. Implementation (d) comprises steps 202 and 204, path 205-2 to step 208, path 209-1 to step 212 and path 213 to END 214. In step 212 there is formed laterally in the emitter (e.g., emitter 30) proximate the first surface (e.g., surface 31) a yet further region (e.g., region 62) of the second conductivity type and a sixth dopant density, thereby deepening the emitter-base junction (e.g., junction 64) beneath the yet further region (e.g., region 62). Implementation (e) comprises steps 202 and 204, path 205-1 to step 206 already described, path 207 to step 212 already described and then path 213 to END 214. Implementations (a)-(e) and the particular steps recited therein illustrate various steps included in such implementations of method 200 and are not intended to imply particular orders or sequences of such steps. All of the embodiments illustrated by implementations (a)-(e) are useful. The embodiment(s) illustrated by implementation(s) (b) and (c) are preferred.

FIGS. 5-12 show simplified cross-sectional views of structures 504-511 of bipolar transistors 21, 51, 61 of FIGS. 1-3 during various stages 404-411 of manufacture. For convenience of explanation, the same reference numbers are used in FIGS. 5-12 as have been used in FIGS. 1-3 to identify the various regions being formed during manufacturing stages 404-411. The doping densities and/or concentrations described in connection with FIGS. 1-3 apply to FIGS. 5-12 and such information is incorporated herein by reference. Ion implantation is a preferred doping means, but any other doping means may also be used. Unless otherwise noted, photoresist is a suitable masking material for such implants, but other masking materials may also be used. Referring now to manufacturing stage 404 of FIG. 5, SC 33 is provided comprising substrate 22 in or on which has been formed buried layer 24 and doped region 26'. In a preferred embodiment, BL 24 is formed in substrate 22 and then doped region 26' extending to surface 31 is formed there-over by epitaxial (EPI) growth. However, other techniques may also be used to form BL 24 and doped region 26' in other embodiments. EPI region 26' has thickness 261' usefully in the range of about 0.5 to 10 micrometers, more conveniently about 0.75 to 5 micrometers and preferably about 1 to 3 micrometers. The doping of base region 26 of FIGS. 1-3 is determined by the doping of epi-region 26' of FIG. 5, the prime (') being used here to indicate that such region initially extends to surface 31. While epitaxial growth is a convenient means of forming doped region 26' (and hence base region 26 of FIGS. 1-3) other fabrication means may be used in other embodiments. Structure 504 comprising SC 33 results. Referring now to manufacturing stage 405 of FIG. 6, shallow spaced-apart trench isolation (STI) regions 361, 362 (collectively 36) of, for example insulating material such as silicon oxide, are formed extending into SC 33 from surface 31 in a conventional manner. Structure 505 results.

Figure 7:
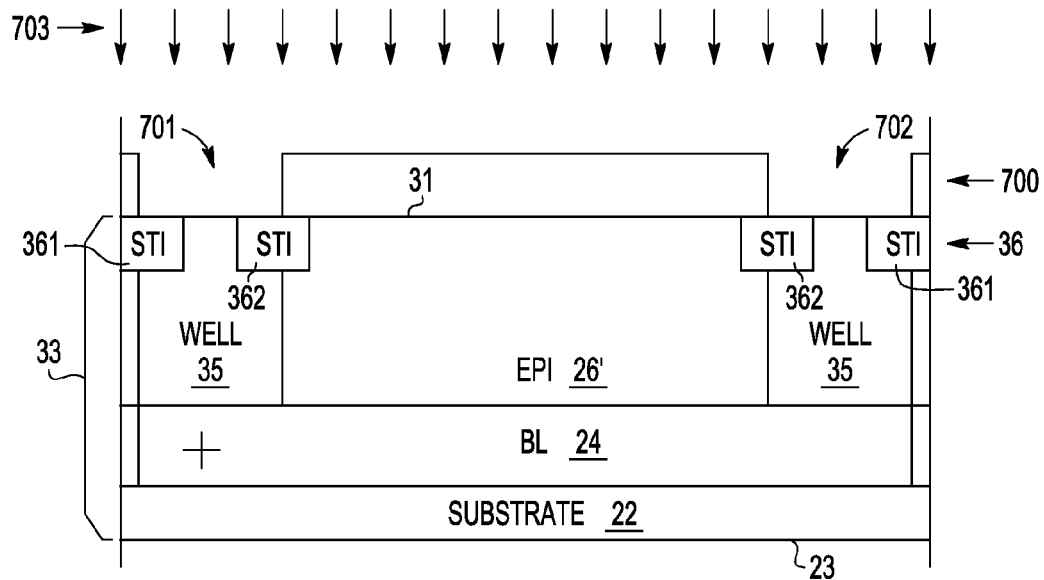
Figure 8:
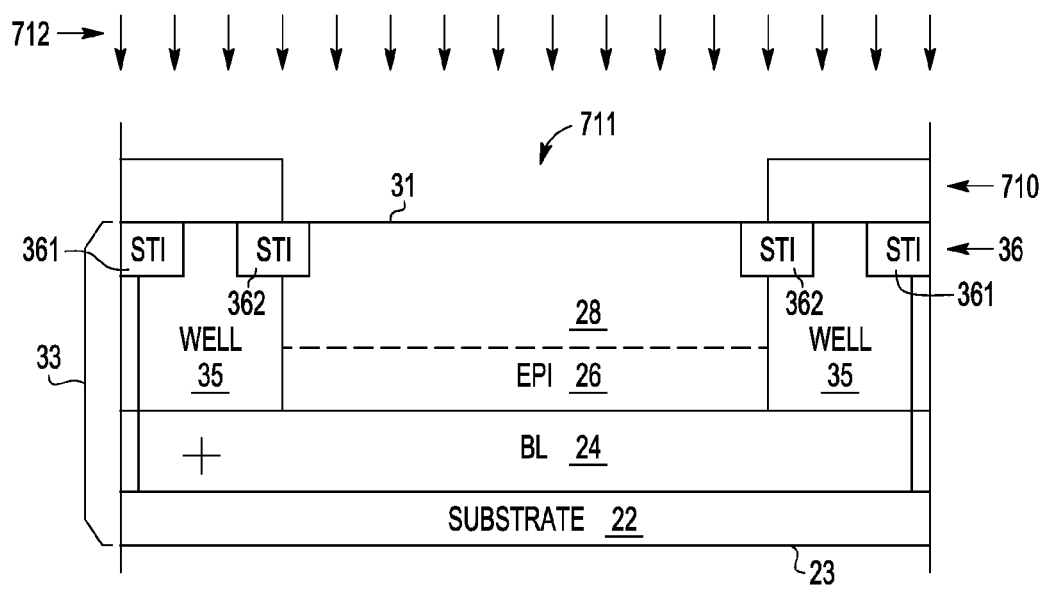

Referring now to manufacturing stage 406 of FIG. 7, mask 700 is applied over surface 31 of structure 505. Mask 700 has openings 701, 702 in location and size appropriate for defining deep (e.g., N type) WELLs 35. Implant 703 is provided through openings 701, 702, thereby forming deep WELLs 35. A chain implant (e.g., N type) having energies, for example and not intended to be limiting, in the range of about 100-1000 KeV is preferred, but other energies and other means for forming deep WELLs 35 adapted to couple BL 24 to surface 31 in the indicated locations may also be used. Structure 506 results. Referring now to manufacturing stage 407 of FIG. 8, mask 700 used in manufacturing stage 406 is desirably removed and mask 710 is applied over surface 31. Mask 710 has opening 711 therein of size and location appropriate to form base region 28 (e.g., P type) within EPI-layer 26' of structure 506 between STI regions 362 and WELLs 35. Implant 712 (e.g., P type) is provided through opening 711 to dope base region 28 as described in connection with FIGS. 1-3. A chain implant having energies, for example and not intended to be limiting, in the range of about 20-200 KeV is preferred, but any other means of providing the desired doping may also be used. Structure 507 results.

Figure 9:
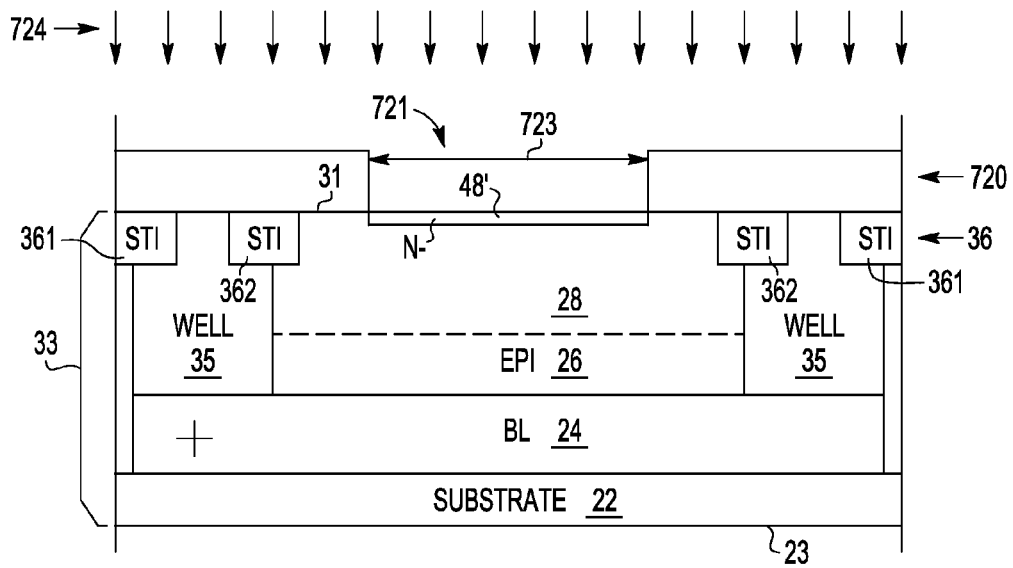

Referring now to manufacturing stage 408 of FIG. 9, mask 710 used in manufacturing stage 407 is desirably removed and replaced by mask 720 having opening 721 of width 723 and location appropriate for forming further doped regions 48 of FIGS. 1-3. Width 723 is preferably such as to span between about the centers of subsequently formed base contact regions 32 (e.g., see FIGS. 1-3 and 12), but smaller or larger widths may also be used in other embodiments. Implant 724 (e.g., N type) is provided through opening 721 to form (e.g., N type) further region 48'. The convention is adopted of identifying the (e.g., N type) further region formed in manufacturing stage 408 by reference number 48' including the prime, and then identifying those portions of region 48' that lie between subsequently formed emitter 30 and base contact region(s) 32 (or between base contact region(s) 32 and still further region(s) 52) by reference number 48 with the prime omitted (e.g., see FIGS. 1-3). Structure 508 results. In still other embodiments a single opening 721 may span the distance between, for example, about the centers of STI regions 362, or multiple openings 721 may be provided corresponding just to the desired locations of subsequent further regions 48 between emitter 30 (or still further region(s) 52) and base contact region(s) 32. Either arrangement is useful. For convenience of explanation, it is presumed in manufacturing stages 409-411 of FIGS. 10-12, that transistor 51 of FIG. 2 including regions 52 is being formed. Persons of skill in the art will understand that transistor 21 of FIG. 1 may be formed by omitting manufacturing stage 409. The modifications of stage 409 needed to form transistor 61 of FIG. 3 are discussed later. Referring now to manufacturing stage 409 of FIG. 10, mask 720 used in manufacturing stage 408 is removed and replaced with mask 730 having opening 731 of width 732. Implant 733 is provided through opening 731 to form doped region 52' (e.g., N type), which includes regions 52 of FIG. 2 and, in this example, the subsequent location of emitter 30 between regions 52 (e.g., see FIG. 2). Again the convention is followed of including a prime (e.g., as in 52') to identify the initial doped region, and omitting the prime from those portions (e.g., portions 52) of such initial region (e.g., region 52') as remain after further doping steps. In other embodiments, implant 733 may be omitted or be limited in area to just regions 52 of FIG. 2 if desired. Structure 509 results.

Figure 11:
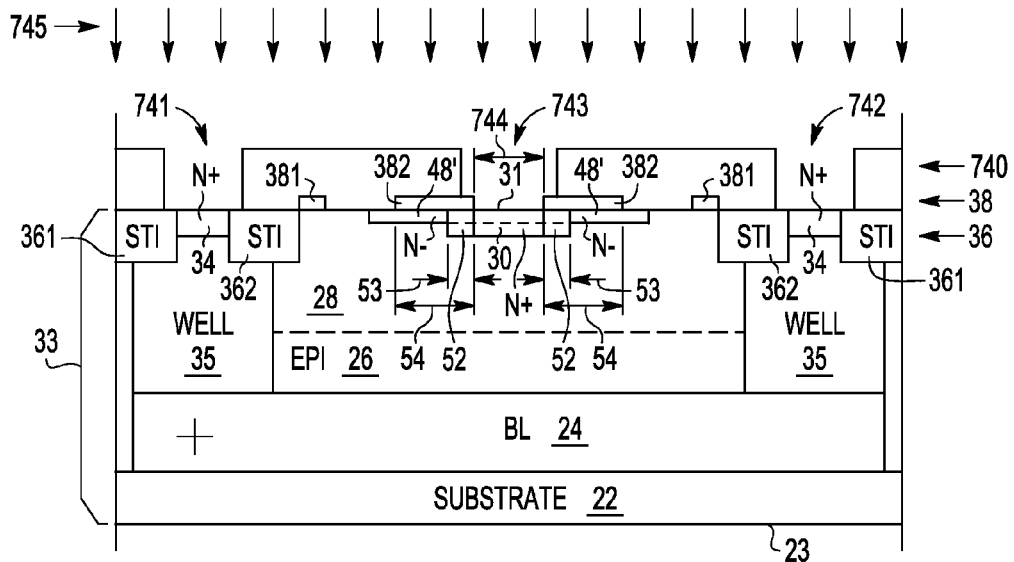
Figure 12:
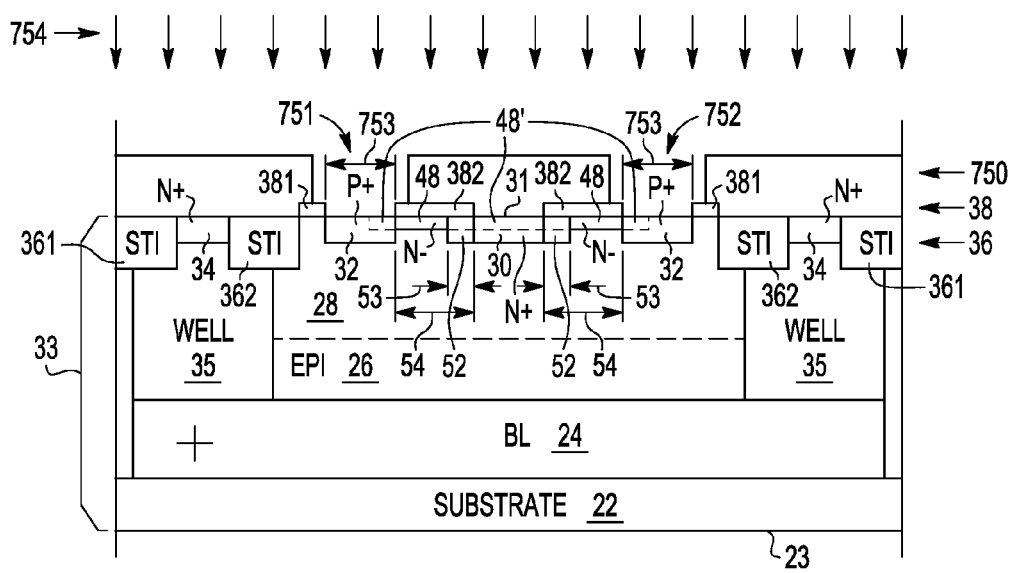

Referring now to manufacturing stage 410 of FIG. 11, mask 730 of manufacturing stage 409 is desirably removed. In a preferred embodiment, blocking layer 38 having portions 381, 382 of, for example an oxide and nitride stack, is applied and patterned as indicated, but may be omitted in other embodiments. Blocking layer 38 is useful, for example, in defining the lateral width of emitter 30 and in making separated silicided contacts to emitter 30 and base contact regions 32 and is included in a preferred embodiment, but may be omitted in other embodiments. Mask 740 is provided over surface 31, having openings 741, 742 corresponding to the desired locations of (e.g., N+) collector contacts 34, and opening 743 corresponding to the desired location of (e.g., N+) emitter 30. Portions 382 of blocking layer 38 are spaced apart by distance 744 and serve to substantially define the lateral extent of emitter 30. In an analogous manner, the lateral spacing of STI regions 361 and 362 determine the lateral width of collector contact regions 34. Implant 745 (e.g., N type) is provided through openings 741-743 to obtain the doping concentrations and depths described in connection with FIGS. 1-3. A typical (e.g., N type) source-drain type implant is generally suitable. Structure 510 results. Referring now to manufacturing stage 411 of FIG. 12, mask 740 of manufacturing stage 410 is desirably removed and replaced with mask 750 having openings 751, 752 of location corresponding to base contact(s) 32 of FIGS. 1-3. Lateral spacings 753 between blocking layer portions 381, 382 substantially determine the lateral width and location of base contact regions 32 formed through mask openings 751, 752. Implant 754 is provided through openings 751, 752 to form base contact(s) 32 as described in connection with FIGS. 1-3. A typical (e.g., P type) source-drain type implant is generally suitable. Structure 511 results. Passivation layers and conductive (e.g., silicided) contacts are then applied in a conventional manner to obtain the structures illustrated in FIGS. 1-3.

Figure 10:
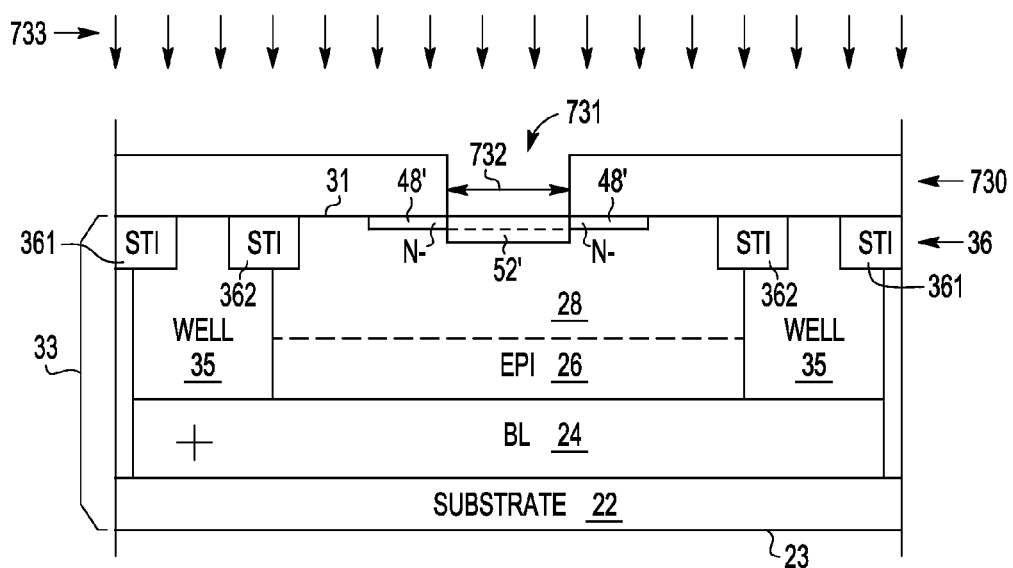

Referring again to manufacturing stages 409-410 of FIGS. 10-11, the configuration illustrated by transistor 61 of FIG. 3 is formed by choosing width 732 of mask opening 731 of FIG. 10, used to locate implant 733 for yet further region 62, to be smaller than width 744 of the gap between blocking layer portions 382 under mask opening 743 of FIG. 11 used to locate (emitter) implant 745. In this manner, yet further region 62 can be formed laterally within emitter 30 (see FIG. 3). In a preferred embodiment, implant 733 for forming region 62 conveniently comprises a somewhat smaller dose than implant 745 for forming emitter 30 and energies that are approximately comparable to or overlap those of implant 745 for forming emitter 30, but other doses and energies can also be used. This combination of implants 733 and 745 desirably provides emitter-base junction 64 (see FIG. 3) under region 62 slightly below the depth of emitter-base junction 66 (see FIG. 3) beneath the remainder of emitter 30 laterally outside of further region 62. Channeling of doping atoms during the implant is believed to somewhat counter dope the part of base portion 28 underlying region 62 thereby lowering the effective base doping concentration therein and increasing the observed beta of transistor 61. This is desirable.

According to a first embodiment, there is provided a bipolar transistor (21, 511 61) having a first surface (31), and comprising a base (26, 28) of a first conductivity type having a first portion (28) extending in part to the first surface (31), a collector (24, 35) of a second, opposite, conductivity type in contact with the base (26, 28), an emitter (30) of the second conductivity type extending into the base (26, 28) at the first surface (31), a base contact (32) of the first conductivity type extending into the base (26, 28) at the first surface and laterally spaced apart from the emitter (30) at the first surface (31), and a further region (48) of the second conductivity type located laterally between the emitter (30) and the base contact (32) proximate the first surface (31). According to a further embodiment, the base (26, 28) has an upper first region (28) and a lower second region (26), wherein the first region (28) of the base (26, 28) has a first dopant concentration, the emitter (30) has a second dopant concentration, the base contact (32) has a third dopant concentration, and the further region (48) has a fourth dopant concentration, and wherein the fourth dopant concentration is intermediate between the first and second dopant concentrations. According to a still further embodiment, the transistor (51) further comprises a still further region (52) of the second conductivity type located proximate the first surface (31) laterally between the further region (48) and the emitter (30). According to a yet further embodiment, the still further region (52) has a fifth dopant concentration intermediate between the second and fourth dopant concentrations. According to a still yet further embodiment, the emitter (30) has a first lateral width (65) and the transistor (61) additionally comprises a yet further region (62) of the second conductivity type and a second lateral width (63) smaller than the first lateral width (65). According to a yet still further embodiment, the emitter forms a first emitter-base junction of a first depth (66) and the yet further region (62) forms a second emitter-base junction of a second depth (64) deeper than the first depth (66). According to another embodiment, the first region (28) of the base (26, 28) has a first dopant concentration about in the range of 1E14 to 1E19 $cm^{-3}$, the emitter (30) has a second dopant concentration about in the range of 1E19 to 1E23 $cm^{-3}$, the base contact (32) has a third carrier concentration about in the range of 1E19 to 1E23 $cm^{-3}$, and the further region (48) has a fourth carrier concentration about in the range of 1E16 to 5E19 $cm^{-3}$. According to still another embodiment, the first region (28) of the base (26, 28) has a first dopant concentration about in the range of 1E14 to 1E19 $cm^{-3}$, the emitter (30) has a second dopant concentration about in the range of 1E19 to 1E23 $cm^{-3}$, the base contact (32) has a third carrier concentration about in the range of 1E19 to 1E23 $cm^{-3}$, the further region (48) has a fourth carrier concentration about in the range of 1E16 to 5E19 $cm^{-3}$, and the still further region (52) has a dopant concentration in the range of about 1E16 to 1E20 $cm^{-3}$.

According to a second embodiment, there is provided a method (200) for forming an electronic device (21, 51, 61), comprising the steps of, providing a semiconductor containing substrate (33) having a first surface (31), forming a bipolar transistor by providing in the substrate (33), a base (26, 28) of a first conductivity type and a first dopant density, an emitter (30) of a second opposite conductivity type and a second dopant density, and a collector (34, 35) of the second conductivity type and a third dopant density, wherein a portion (28) of the base (26, 28), a base contact (32) and the emitter (30) extend to the first surface (31), and forming in the portion (28) of the base (26, 28) at the first surface (31) a further region (48) of the second conductivity type and a fourth dopant density located laterally between the base contact (32) and the emitter (30). According to a further embodiment, the fourth dopant density is more than the first dopant density and less than the second dopant density. According to a still further embodiment, the method (200) further comprises forming in the portion (28) of the base (26, 28) at the first surface (31) a still further region (52) of the second conductivity type and a fifth dopant density different than the fourth dopant density. According to a yet further embodiment, the still further region (52) is located laterally between the further region (48) and the emitter (30). According to a still yet further embodiment, the fifth dopant density is more than the fourth dopant density and less than the second dopant density. According to a still yet further embodiment, the method (200) additionally comprises forming a yet further region (62) of the second conductivity type extending at least partly below the emitter (30). According to a yet still further embodiment, the yet further region (62) has an emitter-base junction (64) within the second region (28) deeper than an emitter-base junction formed by a portion of the emitter (30) lying laterally outside the yet further region (62).

According to a third embodiment, there is provided a semiconductor device (21, 51, 61), comprising coupled NPN or PNP regions and contacts thereto (24, 35, 26, 28, 30, 32, 34) having portions (28, 30, 32, 34) extending to a first surface (31), wherein a first portion (28) of a first conductivity type has an Ohmic contact region (32) therein of the first conductivity type at the first surface, a second portion (30) of a second opposite conductivity type extends into the first portion (28) at the first surface (31) forming an NP or PN junction (64) therewith laterally spaced apart from the contact region (32) at the first surface (31), and a further region (48) of the second conductivity type in the first portion (28) forming an NP or PN junction therewith, wherein the further region (48) extends laterally substantially between the second portion (30) and the contact region (32) at the first surface (31). According to a further embodiment, the first portion (28) has a first dopant concentration, the second portion (30) has a second dopant concentration, the contact region (32) has a third dopant concentration, and the further region (48) has a fourth dopant concentration greater than the first and less than the second dopant concentration. According to a still further embodiment, the device additionally comprises a still further region (52) of the second dopant type coupled between the further region (48) and the second portion (30) at the first surface (31). According to a yet further embodiment, the still further region (52) has a fifth dopant concentration intermediate between the fourth and second dopant concentrations. According to a still yet further embodiment, the second portion (30) has a first junction depth (66) with the first portion (28), and wherein the device (61) additionally comprises a yet further region (62) of the second conductivity type having a second junction (64) depth with the first portion (28) greater than the first junction depth (66).

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming an electronic device, comprising the steps of:
   providing a semiconductor containing substrate having a first surface;
   forming a bipolar transistor by providing in the substrate, a base of a first conductivity type and a first dopant density, an emitter of a second opposite conductivity type and a second dopant density, and a collector of the second conductivity type and a third dopant density, wherein a portion of the base, a base contact and the emitter extend to the first surface; and
   forming in the portion of the base at the first surface a further region of the second conductivity type and a fourth dopant density located laterally between the base contact and the emitter, wherein the forming the further region includes performing a first implant;
   forming, in the portion of the base, a still further region of the second conductivity type, the still further region being next to the emitter, the forming the still further region includes performing a second implant;
   wherein the further region extends to the base contact and the still further region at the first surface, the still further region extends to the emitter.

2. The method of claim 1, wherein the fourth dopant density is more than the first dopant density and less than the second dopant density.

3. The method of claim 2, wherein the forming the still further region further includes forming, in the portion of the base at the first surface, the still further region of the second conductivity type and having a fifth dopant density different than the fourth dopant density.

4. The method of claim 3, wherein the still further region is located laterally between the further region and the emitter.

5. The method of claim 3, wherein the fifth dopant density is more than the fourth dopant density and less than the second dopant density.

6. The method of claim 2, further comprising forming a yet further region of the second conductivity type extending at least partly below the emitter.

7. The method of claim 6, wherein the yet further region has an emitter-base junction deeper than an emitter-base junction formed by a portion of the emitter lying laterally outside the yet further region.

8. The method of claim 6, wherein the yet further region extends laterally between laterally adjacent areas of the first conductivity type, a lateral width of the yet further region between the laterally adjacent areas of the first conductivity type is less than a lateral width of the emitter.

9. The method of claim 1 wherein:
   the performing the first implant includes performing the first implant through a first mask;
   the performing the second implant includes performing the second implant through a second mask.

10. A method for forming an electronic device, comprising the steps of:
    forming a bipolar transistor in a substrate, the bipolar transistor comprising:
      a base of a first conductivity type;
      a collector of a second, opposite conductivity type in contact with the base;
      an emitter of the second conductivity type extending into the base at a first surface; and
      a base contact of the first conductivity type extending into the base at the first surface and laterally spaced apart from the emitter; and
    forming a near-surface region of the second conductivity type in the base immediately under the first surface and extending laterally from the emitter to the base contact, the near-surface region comprising a first region extending from the base contact toward the emitter and having a peak doping concentration less than the peak doping concentration of the emitter, the near-surface region comprising a second region of the second conductivity type in the base at a location laterally between the first region and the emitter, wherein the second region has a greater peak doping concentration of the second conductivity type than the first region.

11. The method of claim 10, wherein a doping profile of the first region falls to about equal to or less than that of the base region within a depth below the first surface less than the emitter depth.

12. The method of claim 10, wherein the first region is produced to have a surface concentration about an order of magnitude greater than the doping density of the base region.

13. The method of claim 10, wherein the base has a first dopant density, the emitter has a second dopant density, the collector has a third dopant density, the first region has a fourth dopant density greater than the first dopant density and less than the second dopant density.

14. The method of claim 13, wherein the second region has a fifth dopant density greater than the fourth dopant density and less than the second dopant density.

15. The method of claim 10, further comprising forming a yet further region of the second conductivity type extending at least partly below the emitter.

16. The method of claim 10 wherein:
    the forming the first region includes performing a first implant;
    the forming the second region includes performing a second implant.

17. A method for forming an electronic device, comprising the steps of:
    forming a bipolar transistor in a substrate, the bipolar transistor comprising:
      a base of a first conductivity type;
      a collector of a second, opposite conductivity type in contact with the base;
      an emitter of the second conductivity type extending into the base at a first surface; and
      a base contact of the first conductivity type extending into the base at the first surface and laterally spaced apart from the emitter; and
    forming at least one near-surface region of the second conductivity type in the base immediately under the first surface and extending laterally from the emitter to the base contact, the at least one near-surface region comprising a further region extending from the base contact toward the emitter and having a peak doping concentration less than the peak doping concentration of the emitter;
    forming a still further region of the second conductivity type in the base at a location laterally between the further region and the emitter, wherein the still further region has a greater peak doping concentration of the second conductivity type than the further region;

forming a yet further region of the second conductivity type extending at least partly below the emitter;

wherein the yet further region extends laterally between laterally adjacent areas of the first conductivity type, a lateral width of the yet further region between the laterally adjacent areas of the first conductivity type is less than a lateral width of the emitter.

18. A method for forming an electronic device, comprising the steps of:

forming a bipolar transistor in a substrate, the bipolar transistor comprising:

a base of a first conductivity type;

a collector of a second, opposite conductivity type in contact with the base;

an emitter of the second conductivity type extending into the base at a first surface of the substrate; and a base contact of the first conductivity type extending into the base at the first surface and laterally spaced apart from the emitter; and forming a yet further region of the second conductivity type beneath the emitter, the yet further region having a maximum lateral width that contacts laterally adjacent areas of the first conductivity type, the maximum lateral width of the yet further region is less than a corresponding lateral width of the emitter;

wherein the emitter forms a first emitter-base junction of a first depth and the yet further region forms a second emitter-base junction of a second depth deeper than the first depth.

19. The method of claim 18, further comprising producing a further region of the second conductivity type in the base immediately under the first surface and extending laterally from the base contact toward the emitter, the further region having a peak doping concentration less than the peak doping concentration of the emitter.

20. The method of claim 19, wherein the doping profile of the further region falls to about equal to or less than that of the base region within a depth below the first surface less than the emitter depth.

* * * * *